(12) United States Patent
Kathman et al.

(10) Patent No.: US 6,798,931 B2
(45) Date of Patent: Sep. 28, 2004

(54) SEPARATING OF OPTICAL INTEGRATED MODULES AND STRUCTURES FORMED THEREBY

(75) Inventors: Alan D Kathman, Charlotte, NC (US); Hongtao Han, Mooresville, NC (US); Jay Mathews, Huntersville, NC (US); John Barnett Hammond, Charlotte, NC (US)

(73) Assignee: Digital Optics Corp., Charlotte, NC (US)

( * ) Notice: Subject to any disclaimer, the term of this patent is extended or adjusted under 35 U.S.C. 154(b) by 313 days.

(21) Appl. No.: 09/983,278

(22) Filed: Oct. 23, 2001

(65) Prior Publication Data

US 2002/0126940 A1 Sep. 12, 2002

Related U.S. Application Data

(60) Provisional application No. 60/273,321, filed on Mar. 6, 2001.

(51) Int. Cl.[7] ............................ G02B 6/12; H01L 21/48; H01L 21/301
(52) U.S. Cl. ........................ 385/14; 438/110; 438/113; 438/458
(58) Field of Search ............................... 385/14; 438/24, 438/27–29, 33, 67, 68, 73, 74, 460, 110, 113, 458

(56) References Cited

U.S. PATENT DOCUMENTS

| | | | | |
|---|---|---|---|---|
| 5,668,033 A | * | 9/1997 | Ohara et al. | 438/113 |
| 6,096,155 A | * | 8/2000 | Harden et al. | 156/250 |
| 6,150,188 A | * | 11/2000 | Geusic et al. | 438/31 |
| 6,472,758 B1 | * | 10/2002 | Glenn et al. | 257/777 |

\* cited by examiner

*Primary Examiner*—Hemang Sanghavi
*Assistant Examiner*—Omar Rojas
(74) *Attorney, Agent, or Firm*—Susan S. Morse

(57) ABSTRACT

A structure having an optical element thereon has a portion of the structure extending beyond a region having the optical element in at least one direction. The structure may include an active optical element, with the different dimensions of the substrates forming the structure allowing access for the electrical interconnections for the active optical elements. Different dicing techniques may be used to realize the uneven structures.

14 Claims, 5 Drawing Sheets

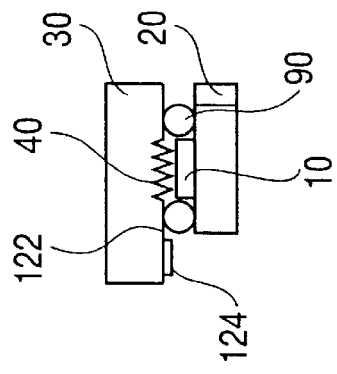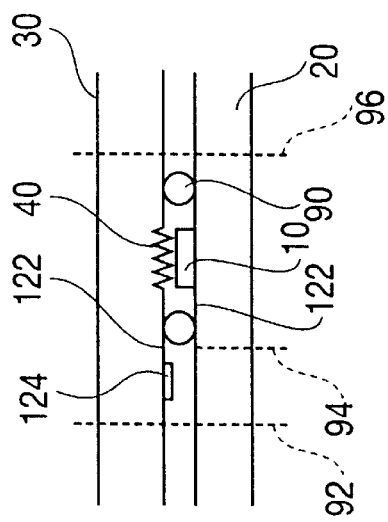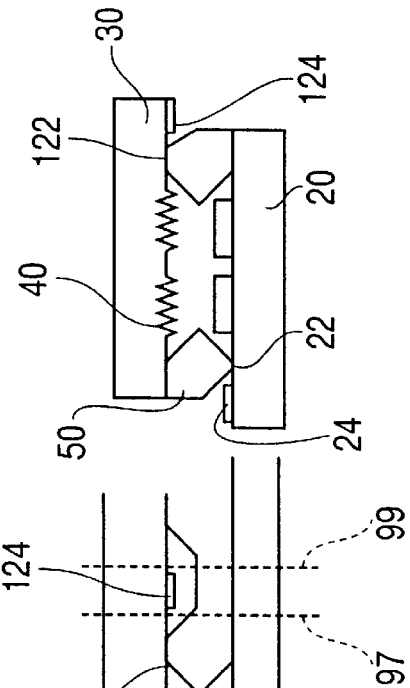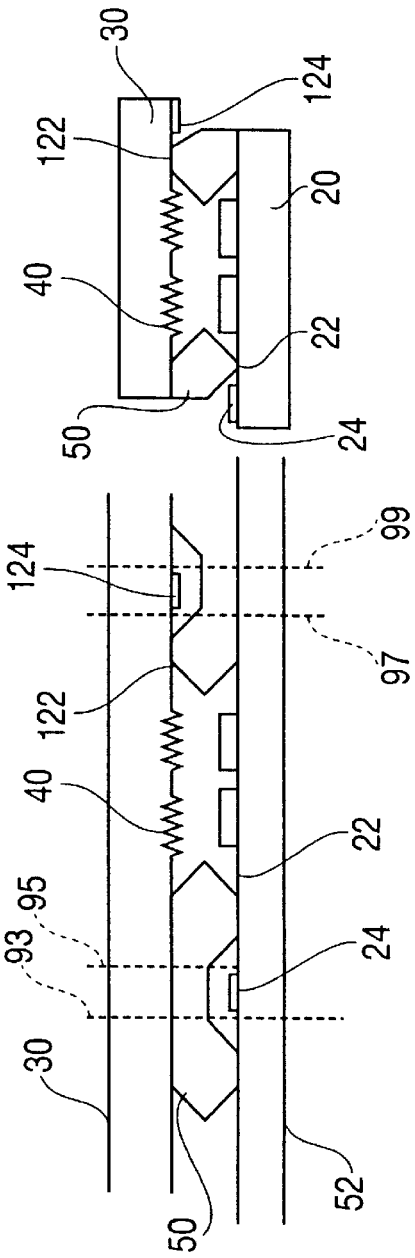

SEPARATING OF OPTICAL INTEGRATED MODULES AND STRUCTURES FORMED THEREBY

CROSS-REFERENCE TO RELATED APPLICATIONS

The present application claims priority under 35 U.S.C. §119 to U.S. Provisional Application No. 60/273,321 entitled "Separating of Electro-Optical Integrated Modules and Structures Formed Thereby" filed Mar. 3, 2001, the entire contents of which are hereby incorporated by reference in their entirety for all purposes.

FIELD OF THE INVENTION

The present invention is directed to techniques for separating modules on a wafer, particularly for use in creating wafer level assembly of electro-optical modules with manageable electrical input-output, and the structures formed thereby. The present invention is further directed to providing a mechanical support ledge for integrating an optical module with another structure, e.g., a circuit board.

BACKGROUND OF THE INVENTION

One obstacle encountered in integrating electrical devices with optical components on a wafer level is how to manage the electrical connections. Typical wafer assembly and separating can yield an excellent optical assembly, but with no feasible location for electrical connections, as shown in FIG. 1. In FIG. 1, the module includes an active element 10 mounted on a submount 20 and an optics block 39 with an optical element 40 thereon. Interconnection lines 22 are formed on the submount 20 to provide electrical signals to and/or from the active element 10. The active element 10, e.g., a vertical cavity surface emitting laser (VCSEL), can bonded to the submount 20 at the wafer level, optics and any spacers aligned thereto and integrated therewith. When the individual modules are separated, the electrical connections 22 to the active element 10 are difficult to access.

Another problem arises when attempting to integrate optical element elements formed on a wafer level with planar systems, such as a printed circuit board, or any system which is not to continue the stacked structure of the wafer level constructions. Support and alignment are both issues in this integration.

One potential solution is to assemble the optics and spacers at the wafer level, then separate and bond to the individual submounts. However, this does not take fill advantage of wafer level assembly.

SUMMARY OF THE INVENTION

The present invention is therefore directed to methods and structures of providing interconnections to electro-optical elements in an electro-optical module formed on a wafer level which overcome at least one of the above disadvantages.

The present invention is also directed to methods and structures of providing alignment and support for wafer based integrated optical subassemblies with non-stacked systems that overcome at least one of the above disadvantages.

At least one of the above and other objects may be realized by providing a method of creating an electro-optic module including providing an active element wafer having a plurality of active elements thereon; aligning a feature wafer having features thereon to the active element wafer, providing an electrical bonding pad on at least one of the active element wafer and the feature wafer, attaching the feature wafer and the active element wafer to form an integrated wafer, and separating dies from the integrated wafer, at least one die including at least one active element and a feature, said separating including separating along different vertical paths through the integrated wafer such that at least a portion of the wafer having the electrical bonding pad extends beyond the other wafer.

At least one of the above and other objects may be realized by providing an integrated electro-optical module including an active element on a first substrate, a feature on a second substrate, a bonding pad on one of the first and second substrates, the first substrate and the second substrate being attached in a vertical direction to one another, a portion of the first and second substrates having the bonding pad thereon extending further in at least one direction than the other substrate.

At least one of the above and other objects may be realized by providing an apparatus including a planar structure having a hole therein, an optical element formed on a surface of a substrate, the surface having the optical element thereon extending through the hole of the planar structure, a mounting surface, integrated with the substrate having the optical element, the mounting surface extending in at least one direction beyond the substrate; and an attachment mechanism securing the optical element to the planar structure via the mounting surface.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which:

FIG. 6A is a schematic side view of a plurality of electro-optic modules before being separated in accordance with the present invention;

FIG. 6B is a schematic side view of a plurality of electro-optic modules of FIG. 6A after being separated in accordance with the present invention;

FIG. 7A is a schematic side view of a plurality of electro-optic modules before being separated in accordance with the present invention;

FIG. 7B is a schematic side view of a plurality of electro-optic modules of FIG. 7A after being separated in accordance with the present invention;

DETAILED DESCRIPTION OF THE EMBODIMENTS

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known devices and methods are omitted so as not to obscure the description of the present invention with unnecessary details. As used herein, the term "wafer" is to mean any substrate on which a plurality of components are formed which are to be separated prior to final use.

Figure 1:
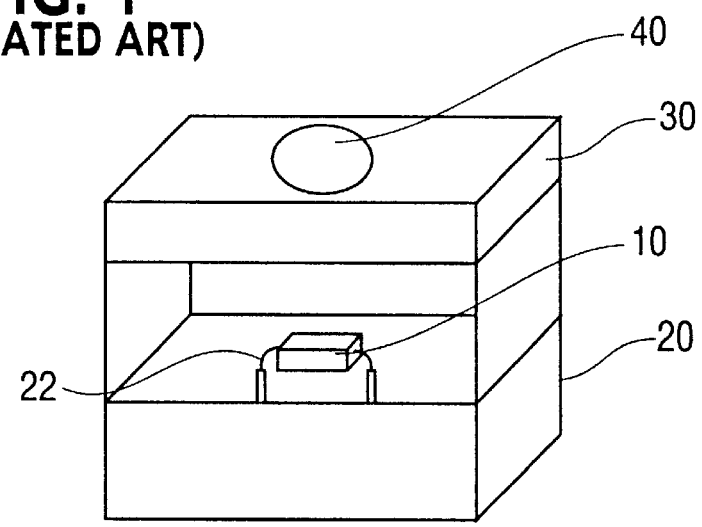
FIG. 1 is a schematic perspective view of an electro-optic module which has been formed at the wafer level and separated in a conventional manner.
Figure 2A:
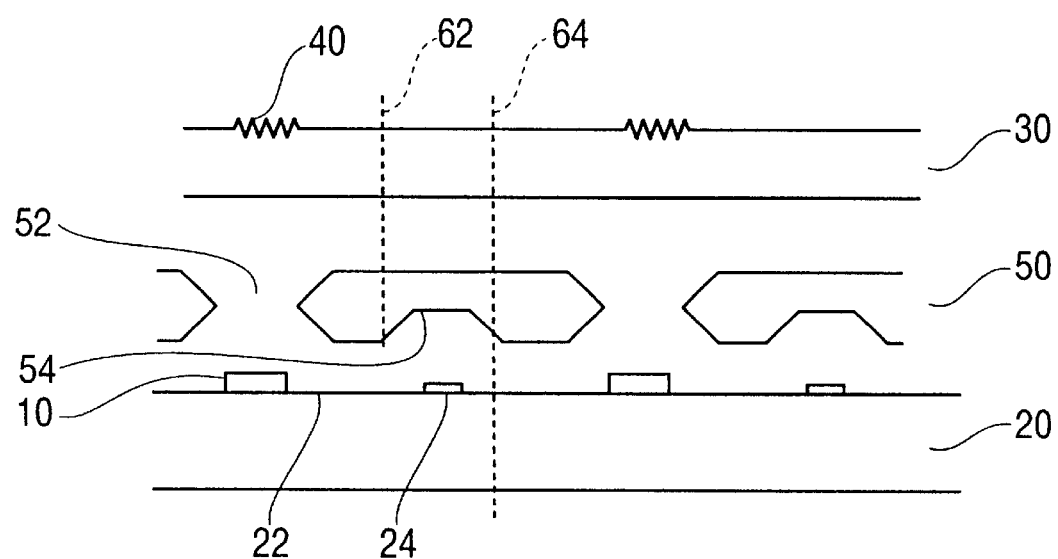
FIG. 2A is a schematic side view of a plurality of electro-optic modules before being separated in accordance with the present invention.

FIG. 2A is an exploded side view of the wafer level assembly of a plurality of integrated electro-optical modules. As in FIG. 1, the submount wafer 20 has an electro-optical element 10 thereon with interconnection tracks 22. An optics wafer 30 having corresponding optical elements 40 formed thereon is also provided. A spacer wafer 50 separates the optics wafer 30 and the submount wafer 20. The spacer wafer includes passages 52 therein which allow light to pass between the optical element 40 and the active element 10. As shown in FIG. 2A, these passages 52 may be formed by etching when the spacer wafer 50 is silicon.

Figure 2B:
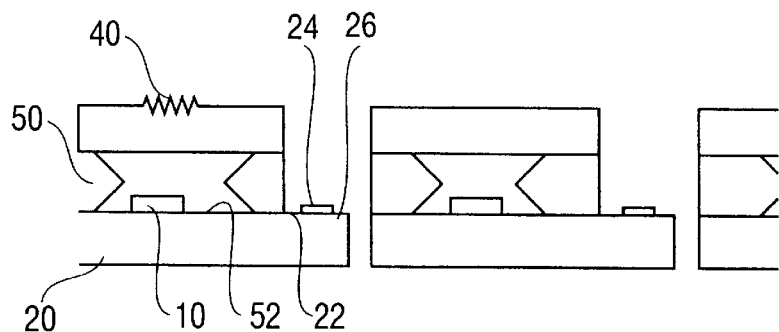
FIG. 2B is a schematic side view of a plurality of electro-optic modules of FIG. 2A after being separated in accordance with the present invention.

In FIG. 2A, the spacer wafer 50 also includes indentations 54, here also formed by etching, These indentations 54 are provided over the bond site 24 so that upon separating along lines 62, 64, the bond site 24 will be accessible in the separated module, as seen in FIG. 2B. This facilitates electrical connections required to the electro-optical element 10. The separating may include dicing the optics wafer 30 and the spacer wafer 50 along line 62 and dicing through all three wafers along line 64. Alternatively, a wide blade may be used to dice the entire width between lines 62, 64 through the optics wafer 30 and the spacer wafer 50, and then using a thin blade to dice only the submount wafer 20. The attached structure may be flipped to facilitate dicing of only the submount wafer 20.

Figure 3A:
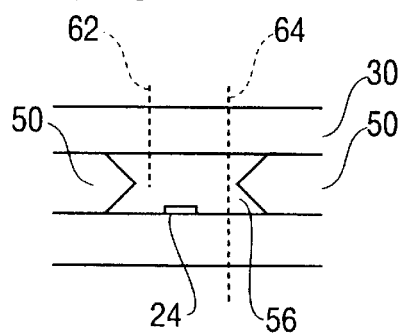
FIG. 3A is a schematic side view of a plurality of electro-optic modules before being separated in accordance with the present invention.
Figure 3B:
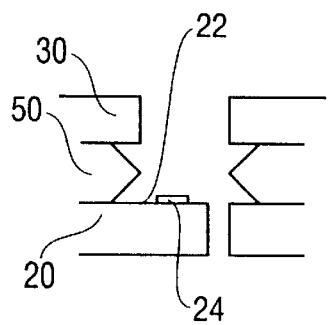
FIG. 3B is a schematic side view of a plurality of electro-optic modules of FIG. 3A after being separated in accordance with the present invention.

An alternative configuration is shown in FIGS. 3A and 3B, in which the spacer wafer includes holes 56 therein over the bond site 24, rather than the indentations 54. The separating lines 65, 64 remain the same and may be realized in either process noted above. However, the resulting structure will not have even edges of the optics wafer 30 and the spacer wafer 50.

Figure 4A:
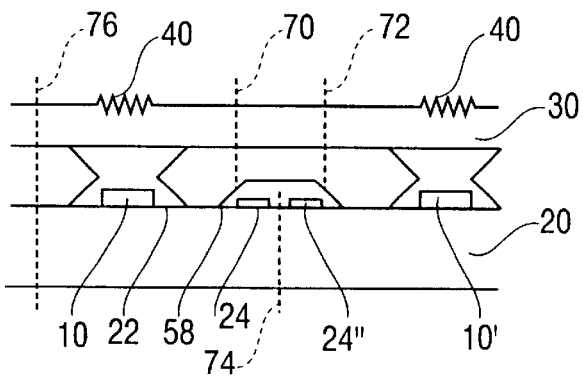
FIG. 4A is a schematic side view of a plurality of electro-optic modules before being separated in accordance with the present invention.
Figure 4B:
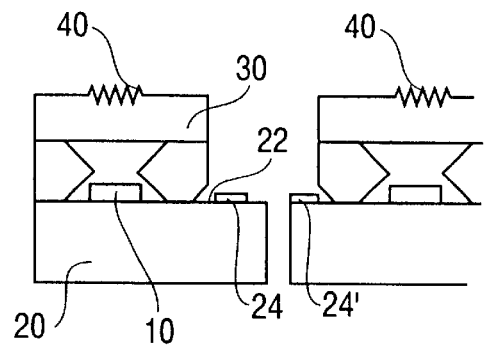
FIG. 4B is a schematic side view of a plurality of electro-optic modules of FIG. 4A after being separated in accordance with the present invention.

Another configuration is shown in FIGS. 4A and 4B. Here, rather than forming the same active element 10—bonding site 24 pairs on the submount wafer 20, adjacent structures will be mirror images of one another. This allows large indentations 58 to be placed over two bonding site 24, 24'. The separating along separating line 76 may be performed in a conventional manner. Separating along separating lines 70, 72 is only through the optics wafer 30 and the spacer wafer 50, and may be realized either by dicing along either line or with a thick dicing blade covering the width of the gap between separating lines 70, 72. The submount wafer 20 is then separated along separating line 74, preferably using a thin blade.

Figure 5:
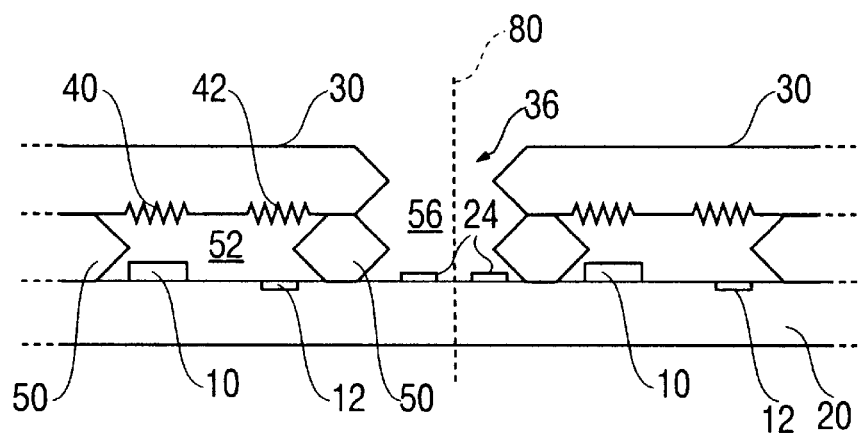
FIG. 5 is a schematic side view of a plurality of electro-optic modules before being separated in accordance with the present invention.

FIG. 5 illustrates another configuration, requiring less separating. Here, the spacer wafer again includes the holes 56. The optics wafer 30 also includes holes 36, here etched in the optics wafer 30, isolating the different optics needed for each module. Also as shown herein, the submount 20 includes two electro-optical elements 10, 12 requiring interconnection. Here the electro-optical elements are different from one another, with the electro-optical element 12 being monolithically integrated with the submount wafer 20. Additional optical elements 42 are provided on the optical wafer 30 for the electro-optical element 12. Here, only separation of the submount wafer 20 along separating line 80 is required to realize the individual modules.

Another alternative is shown in FIGS. 6A–6B. Here, a bonding pad 124 is provided on the optics wafer 30. An interconnection line 122 connecting the active element 10 and the bonding pad 124 would be on both the mount wafer 20 and the optics wafer 30. As shown on FIGS. 6A and 6B, the bonding between the mount wafer 20 and the optics wafer 30 is via an electrically conductive material, here shown as solder balls 90. Alternatively, the spacer used in the previous configurations could be coated with metal where needed to provide the lead from the active element 10 to the bonding pad 24 on the optics wafer 30. Now the separating lines 92, 94, 96 lead to a separation of the module that results in the optics wafer 30 extending beyond the mount wafer 20 in at least one direction, i.e., so that the bonding pad 124 is easily accessible.

Another alternative is shown in FIGS. 7A–7B. Here, one bonding pad 124 is provided on the optics wafer 30 while another bonding pad 24 is provided on the mount wafer 20. A spacer wafer 50 is also provided in this configuration. The interconnection line 122 connecting the bonding pad 124 and the active element 10 would be on the mount wafer 20, the spacer wafer 50 and the optics wafer 30. As shown on FIGS. 7A and 7B, the interconnection line 122 follows the spacer wafer 50 between the mount wafer 20 and the optics wafer 30. Alternatively, a metal or other electrically conductive material may be patterned on the wafer, and the interconnection line 122 being only on the mount wafer 20 and the spacer wafer 30, with the electrically conductive material on the spacer wafer 50 providing connection therebetween. Now separating lines 93, 95, 97, 99 lead to a separation of the module that results in the optics wafer 30 extending beyond the mount wafer 20 in at least one direction, i.e., so that the bonding pad 124 is easily accessible, and the mount wafer 20 extending beyond the optics wafer 30 in at least one direction, i.e., so that the bonding pad 24 is easily accessible.

Figure 8:
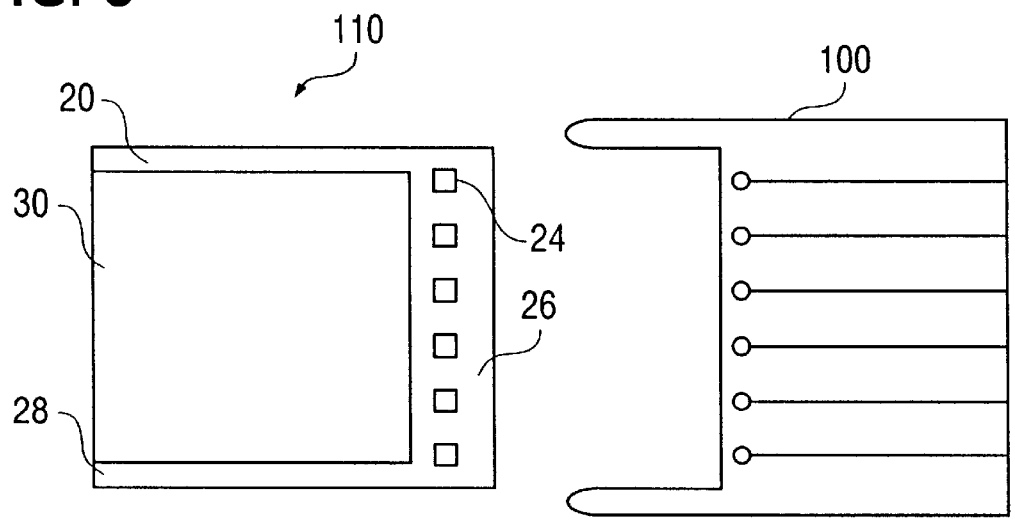
FIG. 8 is a top view of the connection of an electro-optic module shown in FIG. 2B with a flexible printed circuit board in accordance with the present invention.

As shown in FIG. 8, a flexible printed circuit board (PCB) 100 may be directly attached to the modules formed by any of the above configurations. While the above configurations show a cross-section of the modules, it is to be understood that any of the electro-optical element—bonding site pairs may be an array thereof, as shown in module 110 of FIG. 8. Due to the separating discussed above, a step 26 formed by the extension of the wafer having the bonding sites 24 thereon readily provides electrical connection to another device, here a PCB 100. Further, the module 110 may be separated to provide steps 28 in the wafer having the bonding pads 24 thereon, here shown as the mount wafer 20, on either side of the other wafer, here shown as the optics wafer 30, to facilitate mechanical strain relief for the flex lead of the PCB. The steps 28 may extend around the whole perimeter.

Figure 9:
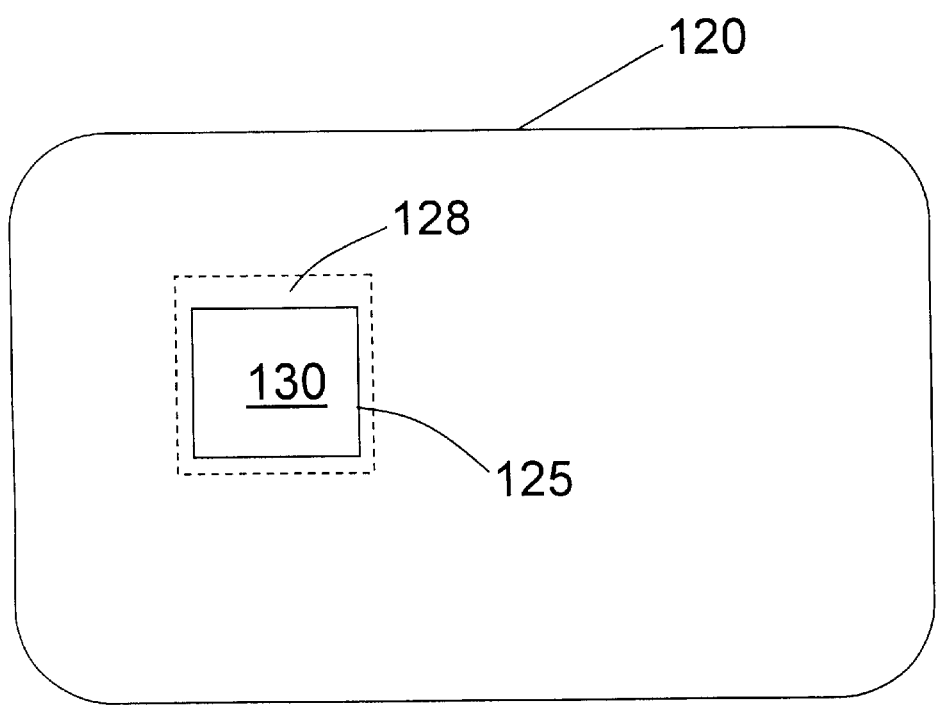
FIG. 9 is a schematic top view of the mounting of an optical subassembly with a circuit board in accordance with the present invention.

Even if electrical interconnections are not to be provided on the steps 28, when integrating an optical subassembly formed on a wafer level with a system which is not t be stacked as the rest of the wafer assembly, these steps 28 may be used to provide support and/or alignment features. For example, as shown in FIG. 9, an optical subassembly 130 to be mounted in a circuit board 120 having a hole 125 therein for receiving the optical subassembly 130 may include steps 128 to provide mechanical support and/or alignment to the circuit board. The steps 128 may extend around the entire perimeter of the optical subassembly 130. The optical subassembly 130 and the steps 128 may be formed on a wafer level. The steps 128 may include alignment features for facilitating alignment of the circuit board 120 and the optical subassembly 130. The steps 128 may provide mechanical mounting surface for mounting the optical subassembly 130 to the circuit board 120. The use of the steps 128 for attachment also allows the bonding material to be kept out of the optical plane.

It will be obvious that the invention may be varied in a plurality of ways, such as the use of different bonding materials, extension in one or more directions, and different, or no, spacer configurations. Such variations are not to be regarded as a departure from the scope of the invention. All such modifications as would be obvious to one skilled in the art are intended to be included within the scope of the appended claims.

What is claimed is:

1. A method of creating an electro-optic module comprising:

provding an active element wafer having a plurality of active elements thereon;

aligning a feature wafer having features thereon to the active element wafer;

providing an electrical bonding pad on at least one of the active element wafer and the feature wafer;

attaching the feature wafer and the active element wafer to form an integrated wafer; and separating dies from the integrated wafer, at least one die including at least one active element and a feature, said separating including separating along different vertical paths through the integrated wafer such that at least a portion of the wafer having the electrical bonding pad extends beyond the other wafer.

2. The method of claim 1, wherein the features are optical elements.

3. The method of claim 1, wherein the features are holes.

4. The method of claim 1, wherein the features are indentations.

5. The method of claim 1, wherein said separating includes dicing.

6. The method of claim 5, wherein said dicing includes dicing from two sides of the integrated wafer.

7. The method of claim 1, further comprising aligning a second feature wafer with the active element wafer and the feature wafer.

8. The method of claim 7, further comprising configuring the second feature wafer as a spacer wafer and the feature wafer as an optics wafer having optical elements thereon and positioning the spacer wafer between the feature wafer and the active element wafer.

9. The method of claim 1, further comprising providing an interconnection line between the active element and the electrical bonding pad.

10. The method of claim 1, wherein the electrical bonding pad is on the active element wafer.

11. The method of claim 1, wherein the bonding pad is on the feature wafer.

12. The method of claim 11, further comprising providing an electrically conductive material between the feature wafer and the active element wafer.

13. The method of claim 12, wherein said providing includes using solder balls for said attaching.

14. The method of claim 12, wherein said providing includes providing the electrically conductive material on an element between the feature wafer and the active element wafer.

* * * * *